United States Patent
Jo

(10) Patent No.: US 8,001,685 B2
(45) Date of Patent: Aug. 23, 2011

(54) METHOD FOR MANUFACTURING PROBE CARD NEEDLES

(75) Inventor: Byung Ho Jo, Gyeonggi-do (KR)

(73) Assignees: Byung Ho Jo, Yongin-si, Gyeonggi-do (KR); Microfriend Inc., Gunpo-si, Gyeonggi-do (KR)

( * ) Notice: Subject to any disclaimer, the term of this patent is extended or adjusted under 35 U.S.C. 154(b) by 668 days.

(21) Appl. No.: 12/063,395

(22) PCT Filed: Aug. 19, 2005

(86) PCT No.: PCT/KR2005/002734
§ 371 (c)(1),
(2), (4) Date: Feb. 8, 2008

(87) PCT Pub. No.: WO2007/021046
PCT Pub. Date: Feb. 22, 2007

(65) Prior Publication Data
US 2008/0197866 A1    Aug. 21, 2008

(51) Int. Cl.
*H05K 3/02* (2006.01)
*H05K 3/10* (2006.01)

(52) U.S. Cl. ........... 29/846; 29/842; 430/314; 430/315; 430/316

(58) Field of Classification Search .......... 29/846, 29/832, 842; 430/312, 314–316
See application file for complete search history.

(56) References Cited

U.S. PATENT DOCUMENTS

| 4,864,178 | A | * | 9/1989 | Bjurling et al. ............. 310/334 |
| 5,513,430 | A |   | 5/1996 | Yanof et al. |
| 6,054,651 | A | * | 4/2000 | Fogel et al. ............. 174/110 F |
| 6,218,203 | B1|   | 4/2001 | Khoury et al. |

FOREIGN PATENT DOCUMENTS

KR   100515235 B1   9/2005

OTHER PUBLICATIONS

PCT International Search Report for PCT Counterpart Application No. PCT/KR2005/002734, mailed Apr. 18, 2006, 2 pages.
Written Opinion for PCT Counterpart Application No. PCT/KR2005/002734, mailed Apr. 18, 2006, 4 pages.

* cited by examiner

*Primary Examiner* — Thiem Phan
(74) *Attorney, Agent, or Firm* — Blakely, Sokoloff, Taylor & Zafman LLP.

(57) ABSTRACT

Disclosed are probe card needles manufactured using microfabrication technology, a method for manufacturing the probe card needles, and a probe card having the probe card needles. The probe needles are manufactured by forming, on a ceramic board, probe needle bases made of conductive metal, and a polymeric elastomer layer, by using photolithography and a photoresist, and continuously depositing conductive metal layers on the probe needle bases in such a manner as to be supported by the polymeric elastomer layer. The probe card comprises: a printed circuit board (PCB) which is connected to a test head for transmitting an electrical signal from a tester; a ceramic board located below the PCB and electrically connected to the PCB by a plurality of interface pins; a jig for mechanically holding the interface pins and the multilayer ceramic board to the PCB; and a plurality of probe needles attached to the lower surface of the multilayer ceramic board and making contact with electrical/electronic devices.

11 Claims, 8 Drawing Sheets

PRIOR ART

Figure 9
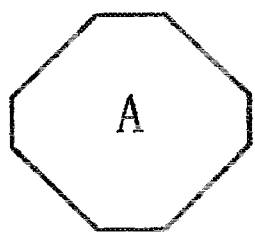
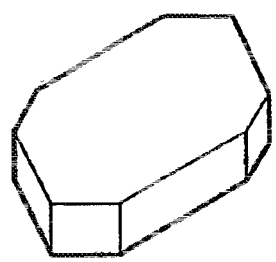
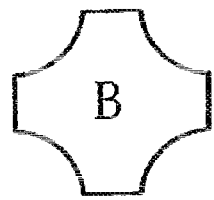
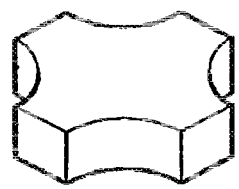
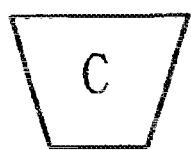
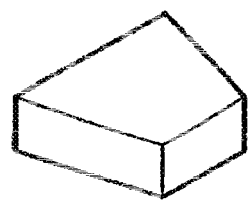

METHOD FOR MANUFACTURING PROBE CARD NEEDLES

TECHNICAL FIELD

The present invention relates to a probe card for testing the performance of electrical/electronic devices, such as semiconductor chips, and more particularly, to probe card needles having considerable strength and elasticity, which are simultaneously formed on a ceramic circuit board using microfabrication technology (microprocessing technology) so as to be able to cope with the miniaturization and high-density integration of semiconductor chips, as well as a method of manufacturing the probe card needles and a probe card including the probe card needles.

BACKGROUND ART

Generally, electrical/electronic devices should be subjected to performance tests for electrical operation after their manufacture in order to divide them into good products and defective products. For wafer-state semiconductor chips, packaged semiconductor chips and printed circuit boards, their performance tests can be performed only when the probe tips of probe card needles make electrical contact with the electrode pads of the chips.

As shown in FIG. 1, a probe card 20 comprises: printed circuit board 21 which makes electrical and mechanical connection with ZIF connectors or pogo-pins 12 mounted on a frog ring 11 of a test head 10; a probe ring 22 made of epoxy resin, fixed on the printed circuit board 21; a few thousand probe needles 23 bonded to the probe ring 22 with an epoxy adhesive and having tungsten probe tips 23a formed at first ends thereof, which make contact with the electrode pads of devices; and wires solder-connecting one end of each of the probe needles 23 to respective strip lines formed on the printed circuit board 21.

FIG. 2 schematically shows a state where a wafer 3 placed on a probe 2 is tested with the probe card 20 electrically connected to the tester 1.

The probe tips 23a are formed by forming first pointed ends of the probe needles 23 with a diameter of about 100 microns using chemical etching. To test the performance of a device, the pointed parts of the probe needles 23 make mechanical and electrical contact with the electrode pads of the device, in which the test is carried out using the elasticity and electrical conductivity of the probe needles 23.

DISCLOSURE

Technical Problem

As recent semiconductor chips become highly integrated, utilize large-area wafers as processing substrates and are developed to have high response speeds in a high-frequency range, the probe card 20 corresponding thereto must meet requirements, such as reduced pad pitch (less than 100 microns) on semiconductor chips, an increase in the number of devices to be tested simultaneously (more than 64 devices), and high signal response speed (1 GHz).

In components of the prior probe card 20, the printed circuit board 21 and the strip lines formed on the printed circuit board 21 have a constant impedance. However, since the wires 24 and the probe needles 23 are exposed, their impedances do not coincide with that of the printed circuit board 21 and the strip lines. Hence, the wires 24 and the probe needles 23 act as inductor components, thus making fast signal response impossible.

Moreover, when the number of devices which can be tested simultaneously is more than 64, the number of probe needles 23 will be more than 5,000, in which case there will be a problem in that manual mounting of the probe needles 23 leads to a great increase in failure rate.

If the pad pitch of semiconductor chips is less than 100 microns, there will be a problem in that the prior tungsten probe needles 23 cannot cope with this case.

The reason is that probe needles adhere to each other because the diameter of the tungsten probe needles 23 is 100±10 microns.

In an attempt to solve this problem, an advanced mode has recently been used, in which the needles 23 are manufactured on the probe card 20 using microfabrication technology based on semiconductor processing technology, such as photolithography, but this mode does not realize a pitch of less than 100 micron.

The present invention has been made to solve the above-described problems occurring in the prior art, and it is an object of the present invention to provide probe card needles which are simultaneously formed on a ceramic circuit board by microfabrication technology based on semiconductor processing technology so as to be able to sufficiently cope with the miniaturization and high-density integration of semiconductor chips, so that the probe needles allow the pad pitch of semiconductor chips to be maintained constant, can be minimized in their failure rate regardless of their number even in the case of an increase in their number, and can realize fast signal response resulting from miniaturization, as well as a method for manufacturing the probe card needles and a probe card including the probe card needles.

Another object of the present invention is to provide probe card needles that are micro-sized so as to cope with the miniaturization and high-density integration of semiconductor chips, the probe card needles having sufficient strength and elasticity even when they are manufactured by microfabrication technology based on semiconductor processing technology, as well as a method for manufacturing the probe card needles and a probe card having the probe card needles.

Technical Solution

To achieve the above objects, in one aspect, the present invention provides probe card needles each comprising: a probe card base formed on a ceramic board by photolithography using a photoresist; a conductive metal layer formed to be connected to the base end; and a polymeric elastomer layer formed just below the conductive metal layer.

In another aspect, the present invention provides a method for manufacturing probe card needles using microfabrication technology, the method comprising the steps of: forming, on a ceramic board, probe needle bases made of conductive metal and having an island seed layer, using photolithography and a photoresist; forming a polymeric elastomer layer on a separate silicon wafer, separating the elastomer layer from the silicon wafer, and filling the separated elastomer layer in the ceramic board in such a manner as to expose the probe needle bases; depositing a conductive metal layer on the probe needle bases and the polymeric elastomer layer in such a manner as to be supported by the polymeric elastomer layer; and forming probe tips on the end of the conductive metal layer.

In still another aspect, the present invention provides a probe card comprising: a printed circuit board (PCB) which is connected to a test head generating an electrical signal; a ceramic board located below the PCB and electrically connected to the PCB by a plurality of interface pins; a jig for holding the ceramic board to the PCB; and a plurality of probe needles formed on the lower surface of the ceramic board and making contact with electrical/electronic devices.

In yet another aspect, the present invention provides a probe card comprising: a printed circuit board (PCB) which is connected to a test head for transmitting an electrical signal from a tester; a ceramic board located below the PCB and electrically connected to the PCB by a plurality of interface pins; a jig for holding the ceramic board to the PCB; and a plurality of probe needles formed on the lower surface of the ceramic board and making contact with electrical/electronic devices.

Advantageous Effects

According to the present invention, the probe needles are manufactured by the application of microfabrication technology. Accordingly, the inventive probe needles have a long life cycle as a result of the prevention of plastic deformation, and show not only improvements in reliability and accuracy over the prior case of mounting probe needles using a manual process, but also sufficient strength and elasticity. Also, according to the present invention, a probe card can be manufactured which meets future requirements, including a pad pitch at the 50-micron level, a speed response at the 2-GHz level, and 15,000 probe needles for the simultaneous test of 256 chips.

DESCRIPTION OF DRAWINGS

FIG. 9 illustrates perspective views showing probe tips for inventive probe needles for use in various applications.

DESCRIPTION OF REFERENCE NUMERALS FOR IMPORTANT ELEMENTS IN THE DRAWINGS

10: test head; 20 and 30: probe card; 21 and 31: PCB; 32: jig; 33: interface pin; 110: multilayer ceramic board; 120 and 160: seed layer; 130, 131, 132, 133, 134 and 220: photoresist; 140 and 230: polymer elastomer layer; 150, 170, 171, 172 and 173: conductive metal layer; 210: silicon wafer; 300: probe needle; and 310: probe tip.

MODE FOR INVENTION

Hereinafter, the present invention will be described in detail with reference to the accompanying drawings.

Figure 1:
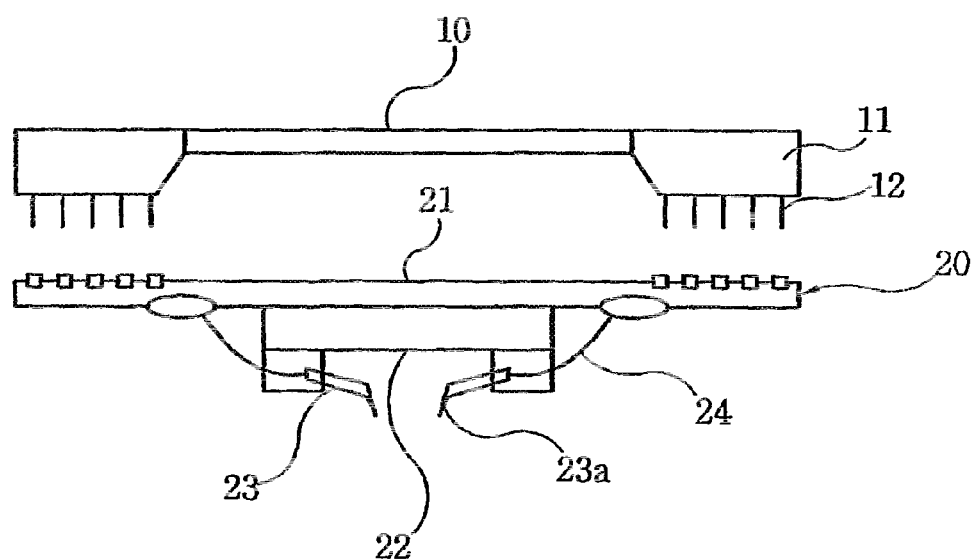
FIG. 1 is a side view showing the prior probe card.
Figure 2:
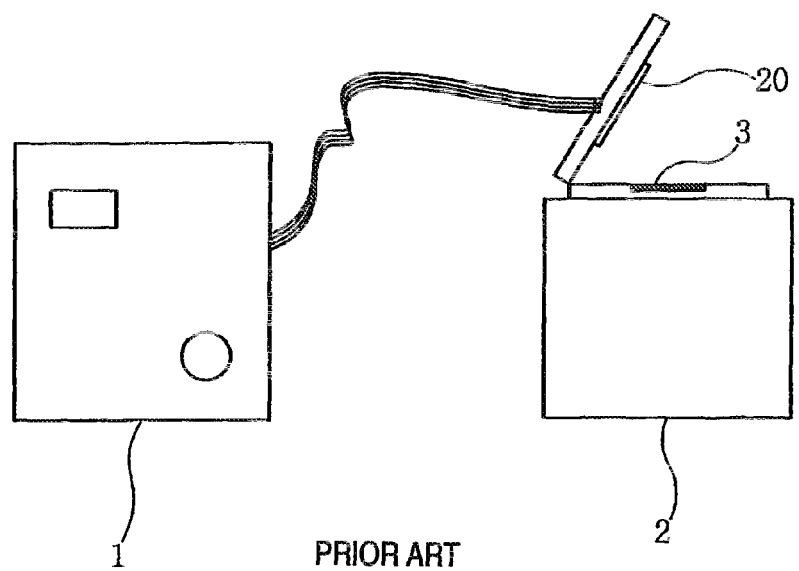
FIG. 2 is a schematic diagram showing a wafer test process using a probe card.
Figure 3:
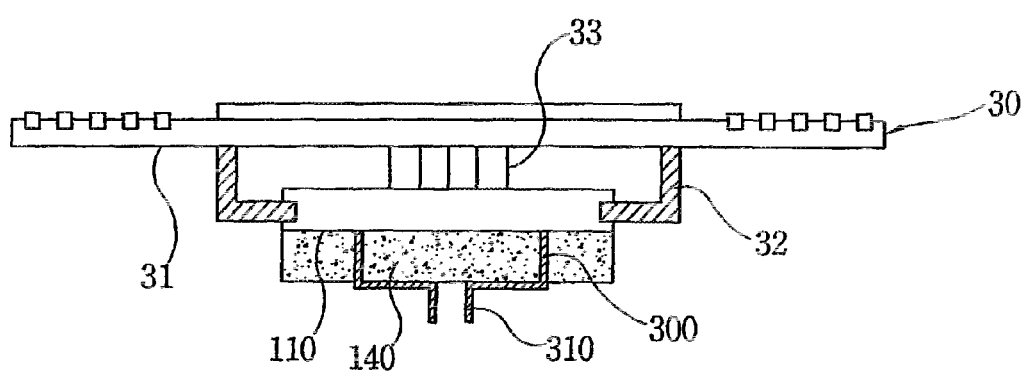
FIG. 3 is a side view showing the inventive probe card.
Figure 4:
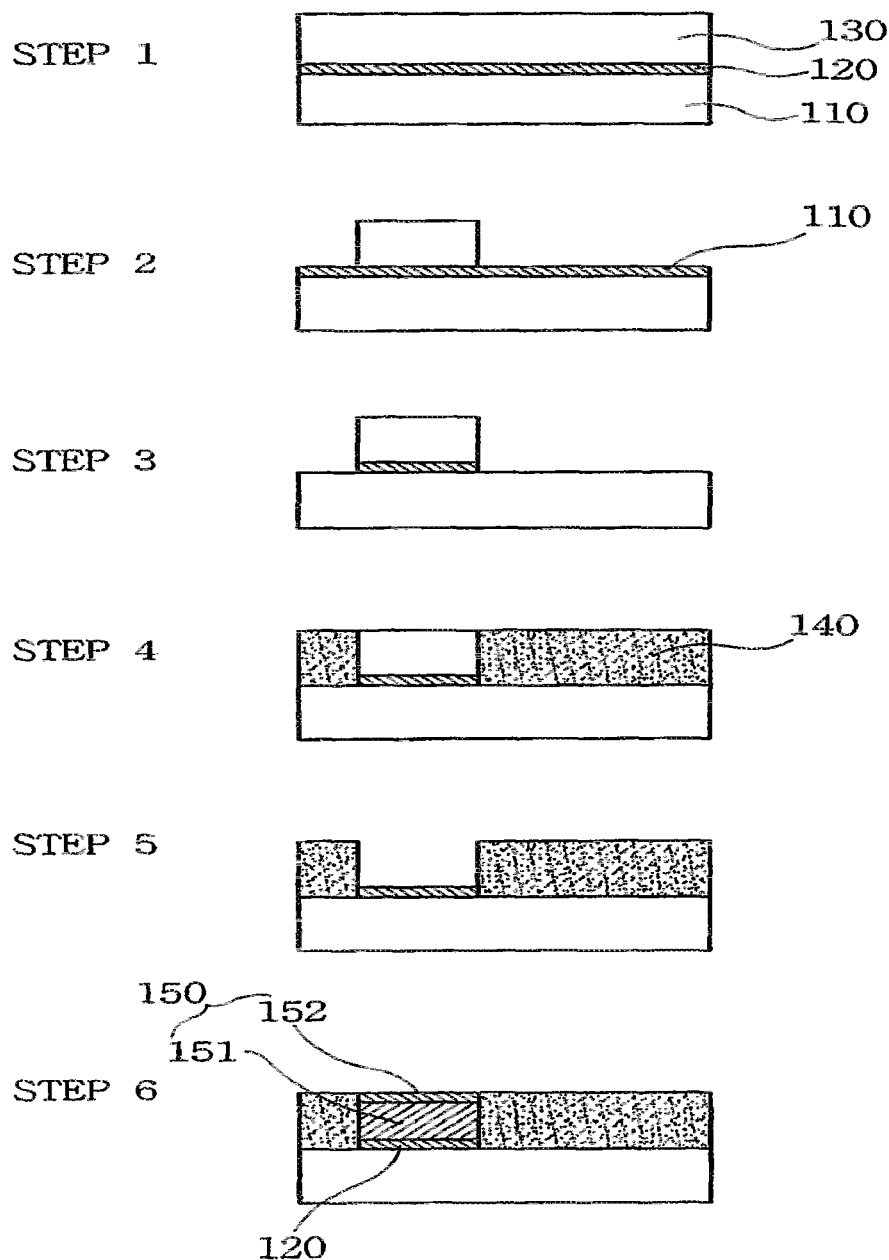
FIG. 4 illustrates cross-sectional views showing each step of a process for forming a polymeric elastomer layer for probe needles on a multilayer ceramic board according to a first embodiment of the present invention.
Figure 5:
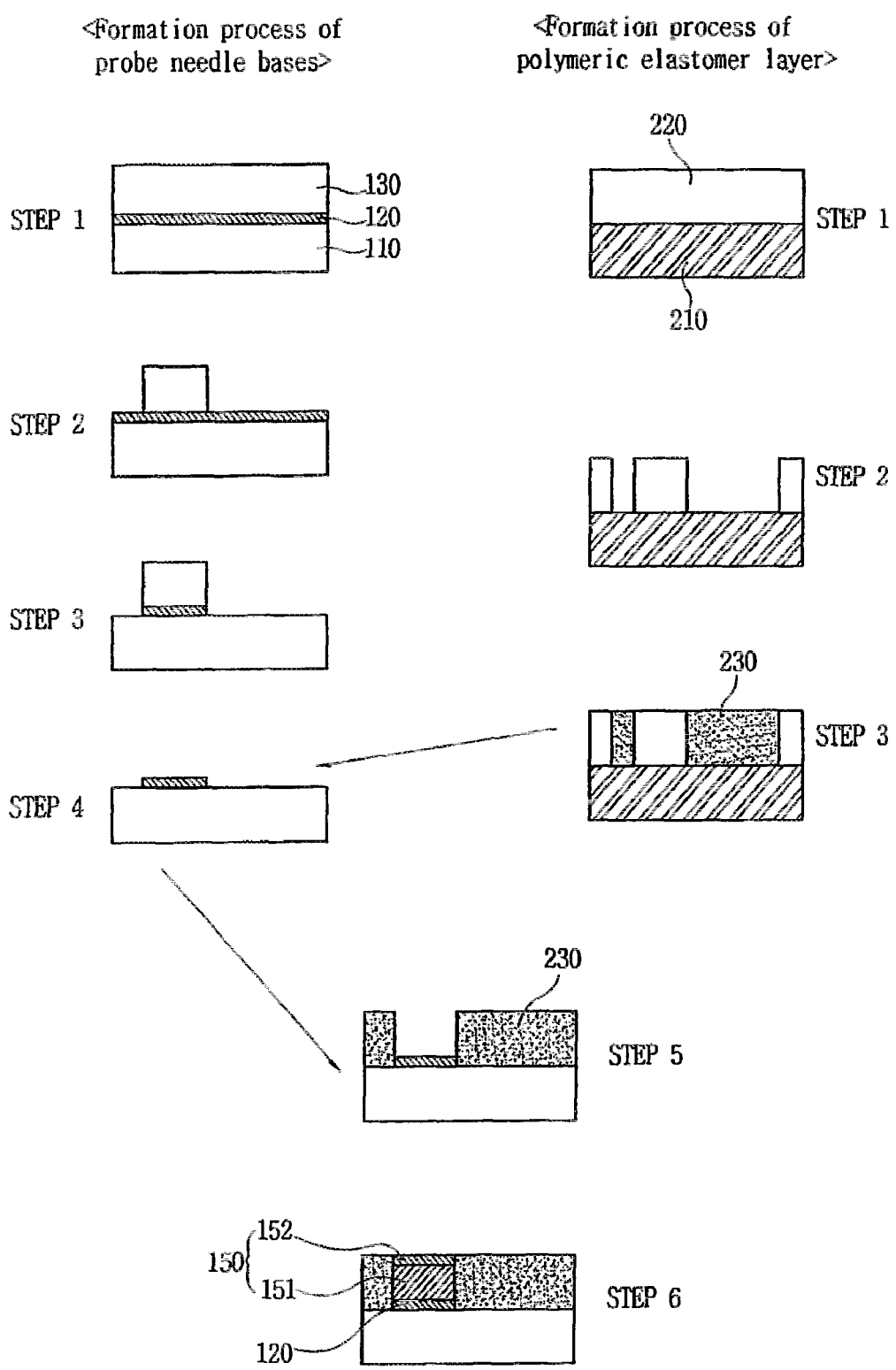
FIG. 5 illustrates cross-sectional views showing each step of a process for forming a polymeric elastomer layer for probe needles on a multilayer ceramic board according to a second embodiment of the present invention.
Figure 6:
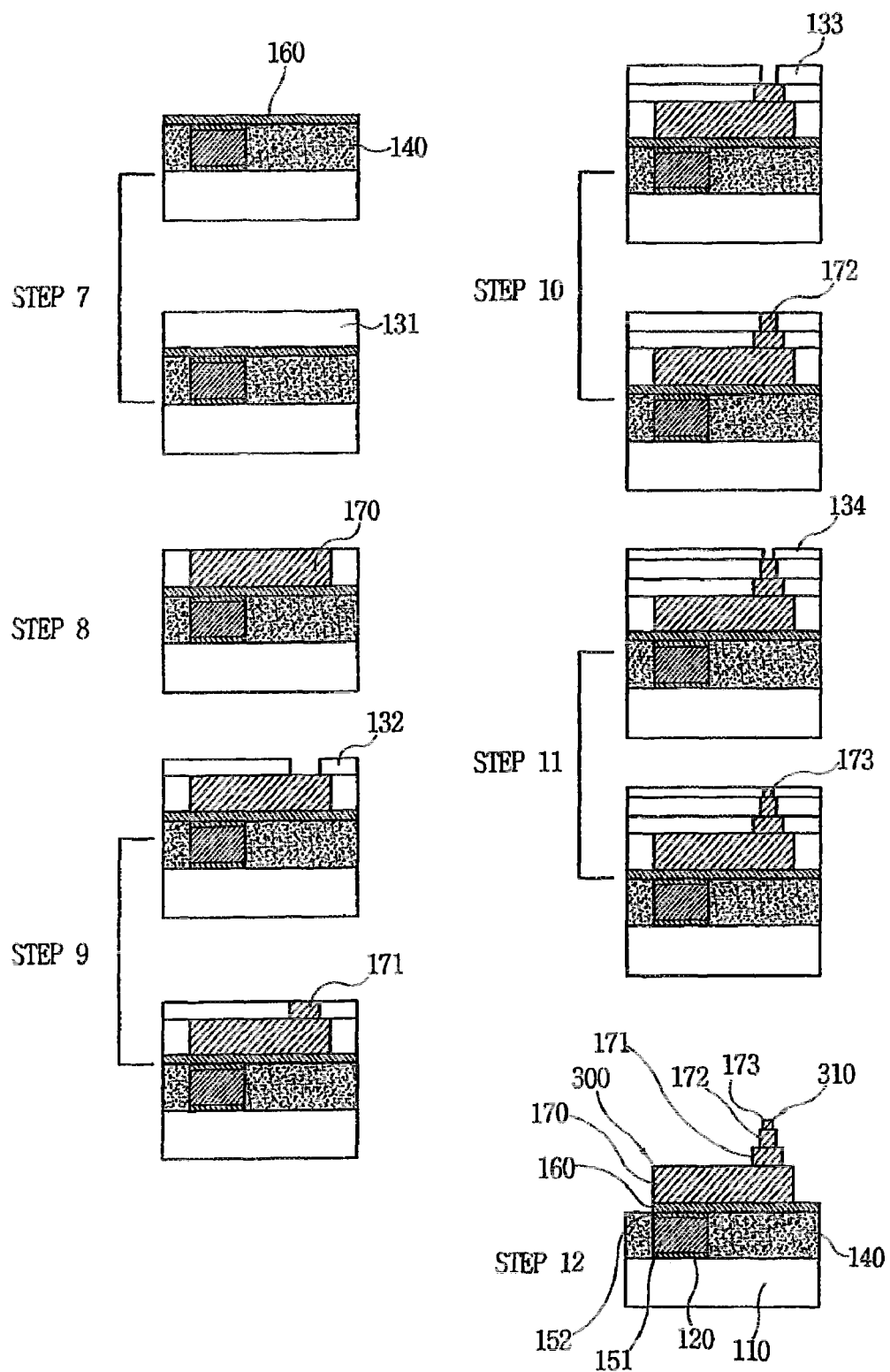
FIG. 6 illustrates cross-sectional views showing each step of a process for forming probe needles on a polymeric elastomer layer according to the present invention.
Figure 7:
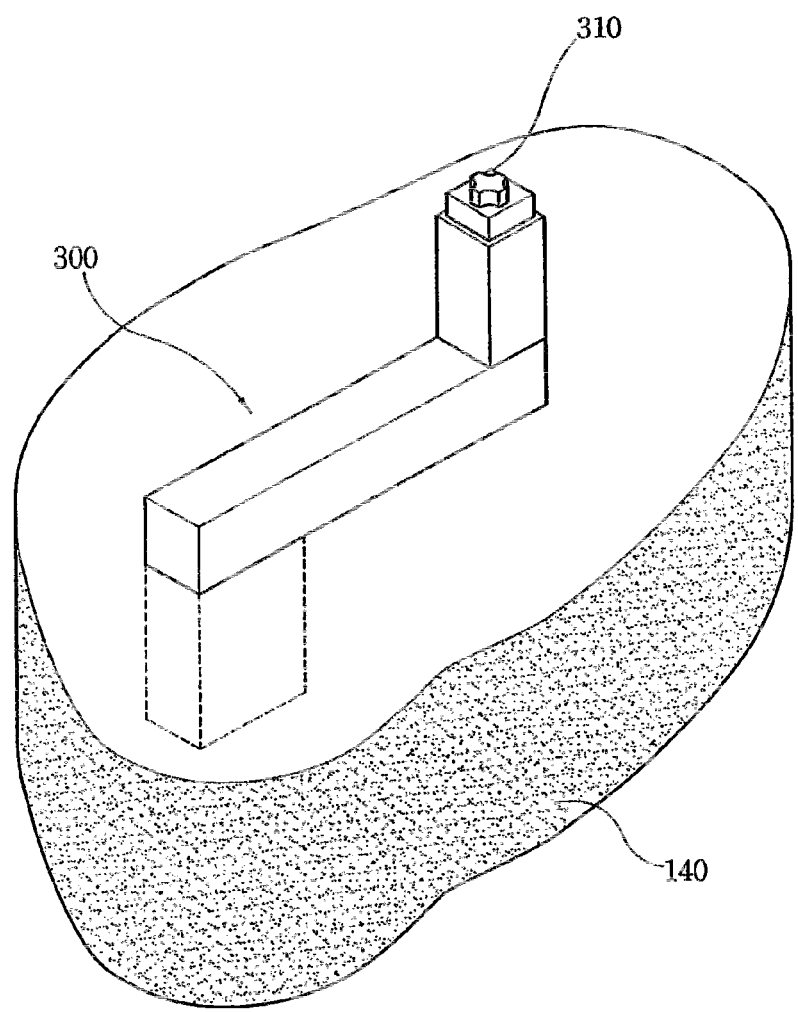
FIG. 7 is a perspective view showing the inventive probe needle for line pads.
Figure 8:
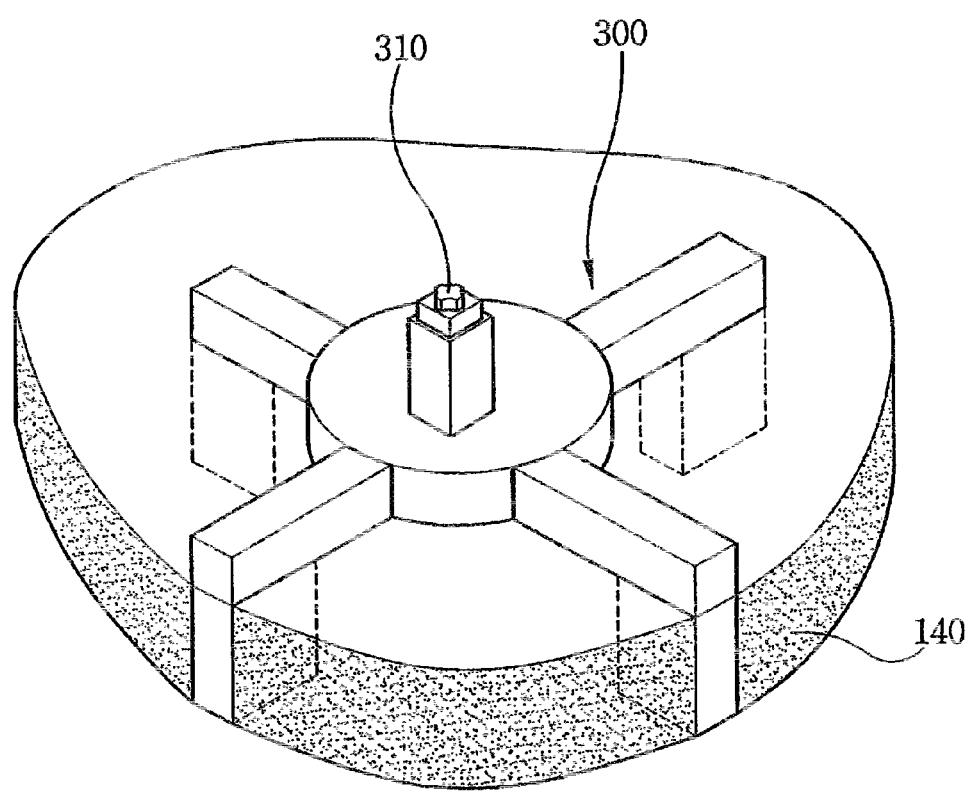
FIG. 8 is a perspective view showing the inventive probe needles for grid arrays.

FIG. 3 is a side view showing the inventive probe card, FIGS. 4 and 5 illustrate cross-sectional views showing each step of a process for forming a polymeric elastomer layer for probe needles on a multilayer ceramic board according to first and second embodiments of the present invention, FIG. 6 illustrates cross-sectional views showing each step of a process for forming probe needles on a polymer elastomer layer according to the present invention, FIG. 7 is a perspective view showing the inventive probe needle for line pads, FIG. 8 is a perspective view showing the inventive probe needles for grid arrays, and FIG. 9 illustrates perspective views showing probe tips for inventive probe needles for use in various applications. As shown in FIG. 3, a probe card 30 according to the present invention comprises: printed circuit board (PCB) 31 which is connected to a test head for transmitting an electrical signal from a tester; a multilayer ceramic board (MLC) 110 located below the PCB and electrically connected to the PCB by a plurality of fine interface pins 33; a jig 32 for mechanically holding the PCB, the interface pins and the multilayer ceramic board; and a plurality of probe needles 300 attached to the lower surface of the multilayer ceramic board and making contact with electrical/electronic devices.

The inventive probe needles are formed by forming, on a ceramic board, probe needle bases made of conductive metal, and a polymeric elastomer layer, using photolithography and a photoresist, and continuously depositing conductive metal layers on the probe needle bases in such a manner as to support them on the polymeric elastomer layer, thus forming probe tips 310.

The polymeric elastomer 140, such as a rubbery material, which will act like a spring, can be formed through two kinds of processes. In the drawings, a process of fabricating only one probe needle 300 is shown. In an actual process, however, pluralities of probe needles are manufactured at the same time.

Examples of the polymeric elastomer 140 include thermoplastic elastomer, polybutylene terephthalate, polyester, rubber, hydrogel polymer, urethane elastomer, silicone elastomer, and polydimethyl siloxane.

As shown in FIG. 4, a first process for forming the polymeric elastomer layer comprises:

(1) a first step of depositing a seed layer 120 on a multilayer ceramic board 110 and coating and baking a photoresist 130 on the surface of the seed layer;

(2) a second step of developing the photoresist by exposure with a mask pattern to form island probe needle bases;

(3) a third step of etching portions of the seed layer 120 exposed by the removal of the photoresist in the second step;

(4) a fourth step of filling polymer elastomer 140 in the exposed portions;

(5) a fifth step of removing the photoresist from the probe needle bases; and (6) a sixth step of plating conductive metal layer 150 on the seed layer 110 from which the photoresist has been removed.

As shown in FIG. 5, a second process of forming the polymer elastomer layer consists of a process of forming the probe needle bases on the multilayer ceramic board and a process of forming the polymer elastomer layer on a silicon wafer.

First, the process of forming the probe needle bases comprises:

(1) a first step of depositing the seed layer 110 on the multilayer ceramic board and applying and baking a photoresist on the surface of the seed layer;

(2) a second step of developing the photoresist through exposure with a mask pattern to form island probe needle bases;

(3) a third step of etching portions of the seed layer 120 exposed by the removal of the photoresist in the second step;

(4) a fourth step of removing the photoresist from the probe needle bases to leave only the island seed layer.

Meanwhile, the process of forming the polymeric elastomer layer 230 comprises:

(1) a first step of coating and baking the photoresist 220 on the silicon wafer 210;

(2) a second step of developing the photoresist 220 by exposure with a mask pattern to expose the desired portions; and (3) a third step of filling the polymer elastomer 230 in the exposed portions.

After forming the island probe needle bases, formed of only the seed layer, and forming the polymeric elastomer layer 230 on an area of the ceramic board not having the island probe needle bases, as described above, the following steps are carried out:

a fifth step of separating the polymeric elastomer layer from the silicon wafer 210 and placing the separated elastomer layer on the multilayer ceramic board in such a manner as to expose the seed layer on the ceramic board; and a sixth step of plating conductive metal layer 150 on the seed layer.

In this regard, the seed layer 120 consists of two metal layers, in which the first metal layer may be made of titanium (Ti) or chromium (Cr), and the second metal layer may be made of copper (Cu) or aluminum (Al). In addition, any other metal may be used for the metal layers if it is a conductive metal.

The conductive metal layer 150 is plated with two layers, consisting of a nickel alloy layer 151 and a gold alloy layer 152, in which the nickel alloy layer is first plated on the layer 150, and then the gold alloy layer is plated on the nickel alloy layer.

The plating may be performed by one of electroless plating and electroplating.

For the steps after forming the probe needle bases and the polymeric elastomer layer on the multilayer ceramic board, the above two methods are performed in the same manner.

Hereinafter, the entire method of manufacturing probe needles, including the first and second processes of forming the polymeric elastomer layer, will be described with reference to FIGS. 4, 5 and 6.

The first method of manufacturing probe needles using the first process comprises:

(1) a first step of depositing the seed layer 120 on the multilayer ceramic board 110 and coating and baking the photoresist 130 on the surface of the seed layer;

(2) a second step of developing the photoresist by exposure with a mask pattern to form island probe needle bases;

(3) a third step of etching portions of the seed layer exposed by the removal of the photoresist in the second step;

(4) a fourth step of charging the polymeric elastomer layer in the exposed portions;

(5) a fifth step of removing the photoresist on the probe needle bases;

(6) a sixth step of plating the conductive metal layer 150 on the seed layer from which the photoresist has been removed;

(7) a seventh step of depositing a seed layer 160 not only on the conductive metal layer formed in the sixth step but also on the polymeric elastomer layer, and coating and baking a photoresist 131 on the surface of the seed layer 160;

(8) an eighth step of patterning the photoresist by exposure and development with a mask pattern to expose the desired portion of the seed layer, and plating the exposed portions with a conductive metal layer 170 made of nickel alloy;

(9) a ninth step of coating and baking a photoresist 132 on the metal layer formed in the eighth step, developing the photoresist through exposure to expose the desired portions of the metal layer 170, and plating the exposed portions with a conductive metal layer 171 made of nickel alloy;

(10) a tenth step of coating and baking a photoresist 133 on the metal layer formed in the ninth step, developing the photoresist through exposure to expose the desired portions of the metal layer 171 and plating the exposed portions with conductive metal layer 172 made of nickel alloy;

(11) an eleventh step of coating and baking a photoresist 134 on the metal layer formed in the tenth step, developing the photoresist through exposure to expose the desired portions of the metal layer 172, and plating the exposed portions with a conductive metal layer 173 made of nickel alloy, thus forming probe tips 310 for probe needles 300; and

(12) a twelfth step of removing the seed layer and photoresist formed on the polymeric elastomer layer so as to leave the conductive metal layers serving as probe needles.

Meanwhile, the second method for manufacturing probe needles using the second process for forming the polymeric elastomer layer comprises:

a process of forming probe needle bases, comprising:

a first step of depositing a seed layer 120 on a multilayer ceramic layer 110, and applying and baking a photoresist on the surface of the seed layer;

a second step of developing the photoresist by exposure with a mask pattern to form island probe needle base;

a third step of etching portions of the seed layer exposed by the removal of the photoresist in the second step; and a fourth step of removing the photoresist on the island probe needle bases to leave only the island probe needle bases serving as a seed layer;

a process of forming a polymeric elastomer layer, comprising:

a first step of forming a polymeric elastomer layer, of applying and baking a photoresist 220 on a silicon wafer 210;

a second step of forming a polymeric elastomer layer, of developing the photoresist 220 through exposure with a mask pattern to expose the desired portions;

a third step of forming a polymeric elastomer layer, of charging polymeric elastomer layer 230 in the exposed portions; and a process of forming probe tips for probe needles, comprising:

a fifth step of removing said polymeric elastomer layer 230 from the silicon wafer 210 and charging the separated elastomer layer in the multilayer ceramic board 110 having only the seed layer formed thereon;

a sixth step of plating the seed layer with a conductive metal layer 150;

a seventh step of depositing a seed layer 160 on the probe needle bases and the polymeric elastomer layer, and applying and baking a phtoresist 131 on the surface of the seed layer 160;

a eighth step of patterning the photoresist 131 through exposure and development to expose the desired portions of the seed layer and plating the exposed portions with a conductive metal layer 170 made of nickel alloy;

a ninth step of applying and baking a photoresist 132 on the conductive metal layer 170 formed in the fourth step, developing the photoresist 132 through exposure to expose the desired portions of the metal layer 170, and plating the exposed portions with a conductive metal layer 171 made of nickel alloy;

a tenth step of applying and baking a photoresist 133 on the conductive metal layer 171 formed in the fifth step, developing the photoresist 133 through exposure to expose the desired portions of the metal layer 171, and plating the exposed portions with a conductive metal layer 172 made of nickel alloy;

a eleventh step of applying and baking a photoresist 134 on the conductive metal layer 172 formed in the sixth step, developing the photoresist 134 through exposure to expose the desired portions of the metal layer 172, and plating the exposed portions with a conductive metal layer 173 made of nickel alloy, thus forming probe tips 310 for probe needles 300; and an twelfth step of removing the seed layer and photoresist formed on the polymeric elastomer layer so as to leave only the conductive metal layers serving as probe needles.

In the above-described method, each of the plated conductive metal layers is planarized with a grinder and a polisher and then subjected to the next step.

Meanwhile, the conductive metal layer formed in the ninth step is made in the form of a metal beam supported by the polymeric elastomer layer.

The polymeric elastomer layer serves to increase the elasticity and contact force of the metal beam. The polymeric elastomer layer may also be preferably subjected to processing, such as drilling of a plurality of holes, during the manufacturing process, so that pressure applied to the plurality of probe needles, for example, upon contact with the electrode pads of semiconductor wafers, is released by the holes. Specially, the polymeric elastomer layer may be subjected to processing, such as drilling, to add other functionality to its original function.

Also, the eighth, ninth and tenth steps in the first method or the second method, may become the first, second and third steps, respectively, in the order of steps.

In the above-described method for manufacturing probe needles through the first or second process of forming the polymeric elastomer layer, the seed layer 120 or 160 consists of two metal layers, in which the first metal layer may be made of titanium (Ti) or chromium (Cr), and the second metal layer may be made of copper (Cu) or aluminum (Al). In addition, any other metal may be used for the seed layer if it is a conductive metal.

These probe needles 300 are formed on a plurality of electrically conductive pads printed on the ceramic board.

The probe needles according to the present invention are manufactured using photolithography and a photoresist. More specifically, the probe needles are manufactured by forming the probe needle bases and the polymeric elastomer layer on the multilayer ceramic board, repeating the photoresist application, baking, exposure and development steps and the conductive metal-plating step, and finally, removing the photoresist and the seed layer.

FIGS. 7 and 8 are perspective views showing probe needles formed through the method as described above. FIG. 7 is for line pads, and FIG. 8 is for grid array pads.

FIG. 9 shows various shapes of probe tips. In FIG. 9, the shapes A and B are for line pads or grid arrays, and the shape C is for line pads where their top and side surfaces define a right angle therebetween. Although a right angle is preferable, it is to be understood that those having a sharp corner (not a right angle) between top and side surfaces thereof are also within the scope of the inventive probe tips.

These probe tips 310 are made to have sharp angle between the top and side surfaces by the use of a grinder, a polisher and an etcher.

The present invention as described above allows many probe needles to be manufactured at the same time through microfabrication technology, unlike the prior art. Thus, the present invention can meet requirements, including narrow pad pitch, production of at least 5000 needles, and fast signal response speed.

Also, although more than 5,000 probe needles can be manufactured using the microfabrication technology described in the present invention, the inherent strength and elasticity of a metal used will not meet the requirements for probe needles, as the miniaturization of electrical/electronic devices accelerates so that pad pitches become narrower and probe needles become smaller.

In other words, in the case where the size of probe needles is reduced below a certain limit, if the probe needles undergo over-drive as required, the metal of the probe needles will exceed its elastic limitation so that the probe needles will not have elasticity and will undergo plastic deformation. If the probe needles are made thinner to overcome the problem of elasticity, the plastic deformation can be avoided, but their pressing force will become weak to make it impossible to realize the required contact force. For this reason, according to the present invention, the polymeric elastomer layer made of, for example, a rubbery material capable of serving as an elastic material, is filled below the probe needles so that it complements the contact force and elasticity of the probe needles lost by miniaturization.

Particularly there are many cases where the pads of non-memory chips are located in peripheral grid arrays, and thus, to cope with these cases, the length of the probe needles will unavoidably become shorter. For this reason, only if a polymeric elastomer layer, such as a rubbery material serving as an elastic material, is inserted below the short probe needles to make a composite material, the elasticity and contact force of the probe needles, lost by miniaturization, will be complemented. This makes it possible to prevent plastic deformation and to obtain the required contact force.

What is claimed is:

1. A method for manufacturing probe card needles using microfabrication technology, the method comprising:

forming, on a ceramic board, probe needle bases made of conductive metal, and a polymeric elastomer layer, through photolithography using a photoresist, wherein the probe needle bases and the polymeric elastomer layer are formed by forming only the probe needle bases on the ceramic board, forming only the polymeric elastomer layer on a silicon wafer, separating the polymeric elastomer layer from the silicon wafer, and charging the separated polymeric elastomer layer in the ceramic board in such a manner as to expose the probe needle bases, wherein the probe needle bases are formed through a process including depositing a seed layer on the multilayer ceramic board and applying and baking a photoresist on the surface of the seed layer;

developing the photoresist through exposure with a mask pattern to form island probe needle bases;

etching portions of the seed layer exposed through the removal of the photoresist; and removing the photoresist from the probe needle bases to leave only the island seed layer, wherein the polymeric elastomer layer is formed by a process including applying and baking the photoresist on the silicon wafer;

developing the photoresist through exposure with a mask pattern to expose the desired portions; and charging the polymeric elastomer layer in the exposed portions, and wherein the polymeric elastomer layer is separated from the silicon wafer, the separated polymeric elastomer layer is placed on the ceramic board having only the seed layer formed thereon, in such a manner as to expose the seed layer, and a conductive metal layer is plated on the seed layer;

depositing a conductive metal layer on the probe needle bases in such a manner as to be supported by the polymeric elastomer layer; and forming probe tips on the end of the conductive metal layer.

2. The method of claim 1, wherein the seed layer consists of two metal layers in which the first metal layer is formed of titanium or chromium and the second metal layer is formed of copper or aluminum.

3. The method of claim 1, wherein the probe needle bases are formed by plating titanium, copper, nickel alloy and gold alloy.

4. The method of claim 1, wherein the probe needle bases are formed by depositing titanium, copper, nickel alloy and gold alloy.

5. The method of claim 1, wherein the probe needles are formed by depositing titanium, copper, nickel alloy, gold alloy, titanium, copper, and nickel alloy.

6. The method of claim 1, wherein a plurality of holes is drilled in the polymeric elastomer layer.

7. The method of claim 1, wherein the probe tips are formed by at least one selected from grinding, polishing and etching processes, such that their top and side surfaces define a right angle therebetween.

8. The method of claim 1, wherein the probe tips are formed by at least one selected from grinding, polishing and etching processes, such that their top and side surfaces define a predetermined angle therebetween.

9. The method of claim 1, wherein the probe tips are formed to have a cross or diamond shape.

10. The method of claim 1, wherein the probe tips have a regular or rectangular shape with cut corners.

11. The method of claim 1, further comprising:

depositing a seed layer on the probe needle bases and the polymeric elastomer layer and applying and baking a first photoresist on the surface of the seed layer;

patterning the first photoresist through exposure and development with a mask pattern to expose the desired portions of the seed layer, and plating a first conductive metal layer on the exposed portions;

applying and baking a second photoresist on the first metal layer, developing the second photoresist through exposure to expose the desired portions of the first metal layer, and plating a second conductive metal layer on the exposed portions;

applying and baking a third photoresist on the second metal layer, developing the third photoresist through exposure to expose the desired portions of the second metal layer, and plating a third conductive metal layer on the exposed portions;

applying and baking a fourth photoresist on the third metal layer, developing the fourth photoresist through exposure to expose the desired portions of the third metal layer, and plating a fourth conductive metal layer on the exposed portions, thus forming probe tips for the probe needles; and removing the seed layer and photoresist formed on the polymeric elastomer layer so as to leave only the conductive metal layers serving as the probe needles.

* * * * *